United States Patent [19]

Kohda et al.

[11] Patent Number: 5,021,999
[45] Date of Patent: Jun. 4, 1991

[54] NON-VOLATILE SEMICONDUCTOR MEMORY DEVICE WITH FACILITY OF STORING TRI-LEVEL DATA

[75] Inventors: Kenji Kohda; Tsuyoshi Toyama; Nobuaki Ando; Kenji Noguchi; Shinichi Kobayashi, all of Hyogo, Japan

[73] Assignee: Mitsubishi Denki Kabushiki Kaisha, Tokyo, Japan

[21] Appl. No.: 282,456

[22] Filed: Dec. 9, 1988

[30] Foreign Application Priority Data

Dec. 17, 1987 [JP] Japan ................. 62-322119

[51] Int. Cl.$^5$ .............. G11C 7/00; G11C 16/04; G11C 16/06
[52] U.S. Cl. ................. 365/168; 365/185; 365/104; 357/23.5
[58] Field of Search .......... 365/104, 168, 185, 189.03, 365/230.01, 181.01; 357/23.5

[56] References Cited

U.S. PATENT DOCUMENTS

| | | | |
|---|---|---|---|
| 4,387,447 | 6/1983 | Klaas et al. | 365/203 |
| 4,417,264 | 11/1983 | Angle | 365/185 X |
| 4,513,397 | 4/1985 | Ipri et al. | 365/185 |
| 4,618,876 | 10/1986 | Stewart et al. | 365/185 X |
| 4,713,797 | 12/1987 | Morton et al. | 365/185 X |
| 4,761,765 | 8/1988 | Hashimoto | 365/185 |
| 4,809,227 | 2/1989 | Suzuki et al. | 365/189.01 X |
| 4,855,955 | 8/1989 | Cioaca | 365/189.01 X |

OTHER PUBLICATIONS

IBM-TDB, vol. 24, No. 7A, Dec. 1981, Multi Bit Storage FET EAROM Cell by Alberts et al., US-CL3-65-185.
EDN Magazine: "Versatile Algorithm, Equipment Cut EPROM Programming Time", by D. Knowlton, AR-265, Mar. 17, 1983, pp. 4-118-4-123.
Sol.-State Electronics: "Operation and Characterization of N-Channel EPROM Cells", by John A. Barnes et al., vol. 21, 1978, pp. 521-529.
Gaffney et al., "Bidirectional Programmable Read-Only Memory", *IBM Technical Bulletin*, vol. 23, No. 7A (Dec. 1980), pp. 2734-2736.

Primary Examiner—Alyssa H. Bowler
Attorney, Agent, or Firm—Lowe, Price, LeBlanc and Becker

[57] ABSTRACT

A non-volatile memory cell includes a MOS transistor of double gate construction. The MOS memory transistor includes a floating gate structure which includes electrically separated first and second segmented floating gates (4a; 4b). For the purpose of writing data, electrons are independently injected into the first and second segmented floating gates. Data are stored in the MOS memory transistor in three different non-volatile storage levels; one with electron accumulated either one of the two segmented floating gates; another with electrons injected into both of the segmented floating gates; and still another with no electrons accumulated on both of the segmented floating gates.

16 Claims, 6 Drawing Sheets

NON-VOLATILE SEMICONDUCTOR MEMORY DEVICE WITH FACILITY OF STORING TRI-LEVEL DATA

BACKGROUND OF THE INVENTION

1. Field of the Invention

This invention relates generally to a non-volatile semiconductor memory device. In particular, this invention relates to a non-volatile semiconductor memory cell having a control gate and a floating gate in a stacked arrangement and capable of storing data of three different levels, and to a non-volatile semiconductor memory device incorporating the memory cells of the type described.

2. Description of the Background Art

Memory devices for non-volatile storage of information are widely used in diverse applications in diverse fields of technology. One of the non-volatile memory device is the electrically programmable read only memory or EPROM. The operation and electrical characteristics of the EPROM are reviewed in an article by D. Knowlton entitled "Versatile Algorithm, Equipment Cut EPROM Programming Time" (EDN, Mar. 17, 1983 or Intel Corp. Article Reprint AR-265, pp. 4-119 to 4-122) and in an article by J. Barns et al entitled "Operation and Characterization of N-channel EPROM Cell" (Solid State Electronics, Vol. 21, 1978, pp. 521-529).

Now, description is made briefly of a double-gate EPROM cell in its structure and operation. With reference to FIG. 1, the double-gate EPROM cell is formed on a P⁻ type semiconductor substrate 1. N-type impurities are ion-implanted into a predetermined region of the substrate 1 to form an impurity region 2 which serves as a drain region. Another impurity region 3 is likewise formed in the semiconductor substrate 1 spaced away from the drain impurity region 2, and acts as a source region. An electrically conductive floating gate 4 made, for example, of polysilicon is disposed over the area of the substrate surface between the drain region 2 and the source region 3 with an insulation film 5 interposed between the floating gate and the substrate surface. Overlying the floating gate 4 is formed a control gate 6 with an insulation layer 7 interposed therebetween.

The floating gate 4 is formed to overlap at its opposite ends the drain impurity region 2 and the source impurity region 3 in a planar view.

In a memory cell array where a plurality of the double-gate memory cells of the type described above are arranged in a matrix of rows and columns, the control gate 6 of each memory cell is connected to a word line for selecting a row, while the drain impurity region 2 is coupled to a bit line for selection of a column. Then, the operation of the memory device will be described.

An injection of electrons into the floating gate of the memory cell in a programming mode is first explained. In the programming mode, the control gate 6 is supplied with a high potential of about 12.5 V, and the drain impurity region 2 is supplied with a high level potential of about 8 V, with both the semiconductor substrate 1 and the source impurity regions 3 grounded. Under the condition, the double-gate MOS transistor forming the memory cell operates in the saturation region. However, the application of the high level potential in the order of 8 V to the drain impurity region 2 causes the inversion region that has been created in the substrate under the floating gate 4 to be pinched off at a portion near the drain region 2. In the pinched-off region between the channel region (or the inversion region) and the drain impurity region 2, electrons are accelerated by the drain-to-source voltage with a constant saturation voltage applied across the channel region. Then, a high intensity electric field is induced in the pinched-off region near the drain region 2. The high intensity electric field accelerates electrons from the channel region into hot electrons which in turn jump over the potential barrier of the gate insulation layer 5 into its conduction band. The hot electrons in the conduction band of the insulation layer 5 are then attracted to and trapped into the floating gate 4 by the effect of the high positive potential level at which the floating gate is maintained. Consequently, the electrons are injected into the floating gate 4, resulting in non-volatile data writing. The voltage Vfg applied to the floating gate 4 is expressed as follows:

$$Vfg = V_G \cdot C1/(C1+C2),$$

where $V_G$ is the gate voltage applied to the control gate 6; C1 represents a capacitance provided by the control gate 6, the interlayer insulating layer 7 and the floating gate 4; and C2 represents a capacitance by the floating gate 4, the gate insulation film 5 and the semiconductor substrate 1.

With injection of the electrons into the floating gate 4, the MOS memory cell transistor shifts its threshold voltage in a positive direction.

To erase the data stored in the memory cell, the double-gate MOS transistor is exposed to ultra-violet (UV) light. Under illumination of UV light, the electrons trapped in the floating gate 4 are excited to such a level that they move across the potential barriers of the gate insulation film 5 and the insulating layer 7 to be absorbed by the substrate 1 or the control gate 6. In effect, the exposure of the memory cell transistor to UV light removes the charge from the floating gate 4 into the substrate 1 or into the control gate 6, resulting in the threshold voltage of the memory cell transistor shifted in a negative direction. Characteristic relation between the gate voltage $V_G$ applied to the control gate and the drain current $I_D$ of the MOS memory cell transistor is illustrated in FIG. 2. As shown in FIG. 2, the memory cell transistor has a threshold voltage of about 1 V in the erased state, and of some 6 V in the programmed state. As the reading voltage of the order 5 V is applied to the control gate 6, the erased memory cell transistor conducts, while the programmed memory cell transistor does not conduct. Accordingly, under application of the reading volta $V_R$ of about 5 V to the control gate 6, when the drain current $I_D$ flows in an amount exceeding the sense current Isen, it is determined that the data "1" is stored in the memory cell. On the other hand, if the flowing drain current $I_D$ is less than the sense current Isen, then it is determined that the data stored in the memory cell is a "0". The sensing of the drain current $I_D$ is performed by a current sensing amplifier provided to the bit line to which the memory cell is connected.

As has been described, the conventional EPROM cell involves a double-gate memory transistor capable of a bi-level data storage in the form of "0" and "1" depending on the electron accumulation on the floating gate.

The conventional non-volatile memory cell of the stacked gate structure, is disadvantageous in that it is limited to the storage of bi-level data or states of "0" and "1", according to the presence and absence of electrons in the floating gate.

If one non-volatile memory cell could store the data of three or more different levels, it instantly leads to an increase in the integration degree of the device and therefore in the memory capacity of the device.

SUMMARY OF THE INVENTION

It is an object of the present invention to provide a non-volatile memory cell free of the deficiencies inherent to the conventional non-volatile memory cell and capable of storing data of three or more different levels.

It is another object of the present invention to provide a non-volatile semiconductor memory device which incorporates non-volatile memory cells capable of storing data of three or more different levels.

A non-volatile memory cell according the present invention has first and second segmented floating gates which are provided individually and separately from each other. More specifically, the non-volatile memory cell of the invention includes a semiconductor substrate of one conductivity type, and a pair of impurity regions of the opposite conductivity type which are provided in the surface of the semiconductor substrate spaced apart from each other to be drain and source regions. A conductive layer is disposed over the substrate surface between the drain and source impurity regions and closer to the drain region to serve as a first floating gate. An insulating layer lies between the conductive layer and the substrate surface. Another conductive layer is also disposed over the substrate surface between the drain and source regions closer to the source region to act as a second floating gate, with an insulating layer placed between the conductive layer and the substrate surface. Overlying the first and second floating gates is a third conductive layer which serves as a control gate. An insulating layer is interposed between the control gate and the first and second floating gates. The first and second floating gates are spaced apart from each other. The first floating gate partially overlaps the drain region while the second floating gate partially overlaps the source region. The control gate is formed extending into the gap portion between the first and second floating gates.

An insulation between the control gate and the substrate surface between the first and second floating gates may preferably have a thickness substantially equal to the insulation layer disposed between the first and second floating gates and the substrate surface.

A non-volatile semiconductor memory device according to the present invention comprises a plurality of double-gate MOS transistor as memory cells. The MOS transistor includes a first level floating gate which comprises first and second segmented floating gates. The plurality of MOS transistors are arranged in an array of rows and columns to form a memory cell array of the memory device. The columns comprise source column lines and drain column lines. The semiconductor memory device further includes a column select unit operable in response to an externally applied address to select a corresponding column coupled to the source region of a selected memory cell transistor, and another column select unit operable in response to the externally applied address to select a corresponding column coupled to the drain region of a selected memory cell transistor. Provided also in the memory device is a unit for applying a predetermined voltage to the selected source column line and drain column line depending on the data to be written, and a control unit for applying a data writing voltage to the control gate during data writing.

Preferably, the column lines coupled to the drains of the memory cells and the column lines connected to the sources of the memory cells are alternately arranged.

With the structure of the memory cell, the memory cell transistor has different conductances depending on whether the charge is accumulated on one of the segmented floating gates or on both of the segmented floating gates, leading to varying drain currents which flow in data read-out. This unique structure of the memory cell permits three different storage states: one with no charge accumulation on both segmented floating gates; another with charge accumulated on either of the segmented floating gates; and still another with charge accumulated on both of the segmented floating gates. The three storage states are defined as a "0" data storage, a "1" data storage and a "2" data storage, respectively.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
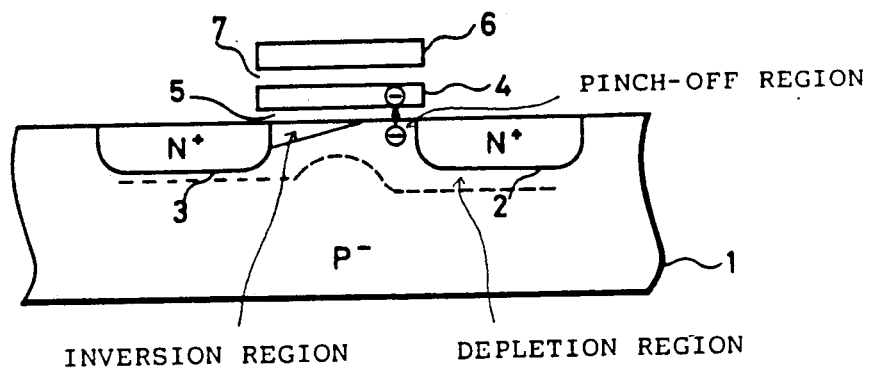
FIG. 1 is a cross sectional view showing a prior-art EPROM cell.
Figure 2:
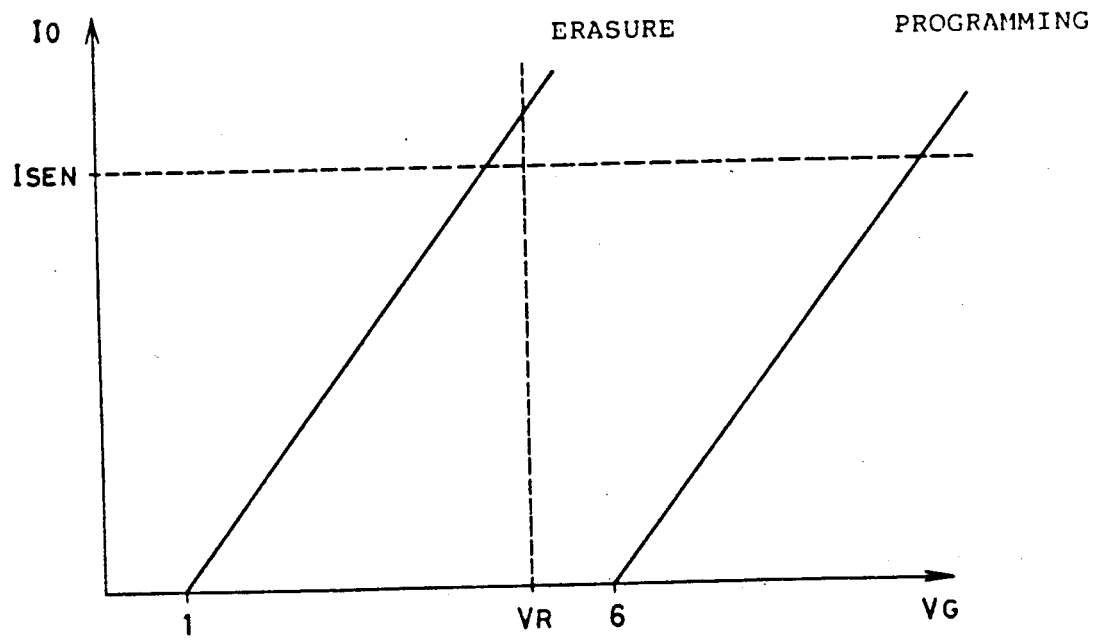
FIG. 2 is a graphic representation showing gate voltage versus drain current relations of the prior-art EPROM cell during its data erasing and data programming operations.
Figure 3A:
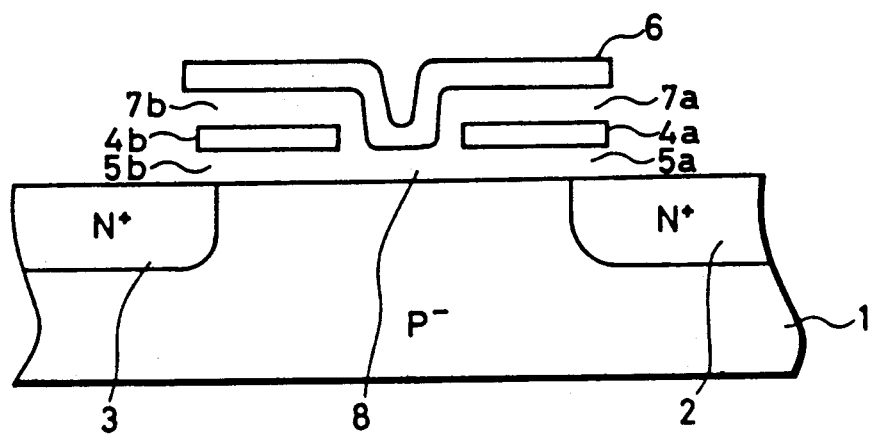
FIG. 3A is a schematic cross sectional view of an EPROM cell according to one preferred embodiment of the invention.
Figure 3B:
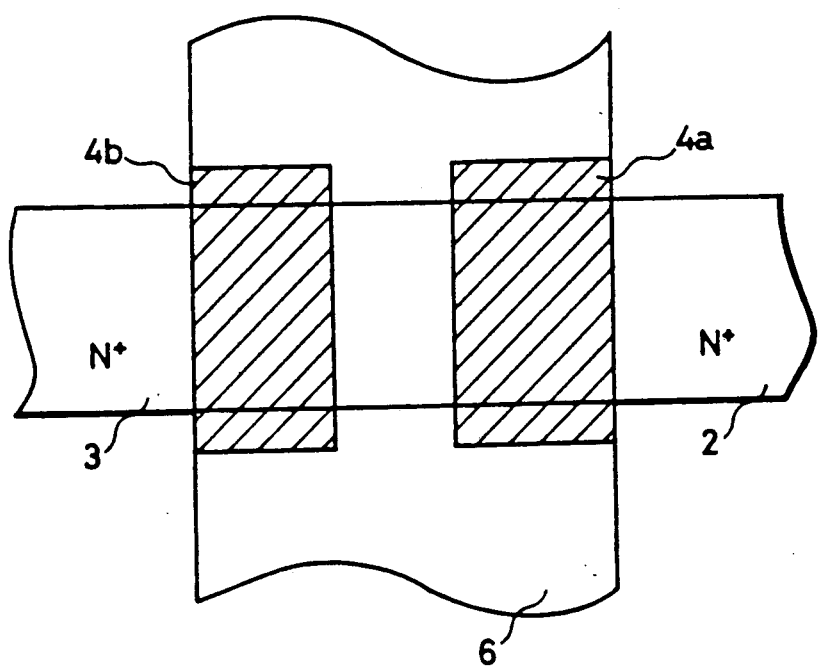
FIG. 3B is a schematic plan view of the EPROM cell of the invention shown in FIG. 3A.

Referring to FIGS. 3A and 3B, an EPROM cell according to an embodiment of the present invention is of the double-gate MOS transistor. The EPROM cell includes a P$^-$ type semiconductor substrate 1, in the surface of which N$^+$ type impurity regions 2 and 3 are provided spaced apart from each other. The impurity region 2 serves as the drain of the MOS transistor, and the other impurity region 3 as the source. Disposed over the surface of the substrate 1 between the drain impurity region 2 and the source impurity region 3 are first and second floating gates 4a and 4b of an identical configuration. The first and second floating gates 4a and 4b are spaced apart from each other, and gate insulation films 5a and 5b are provided to underline the floating gate 4a and 4b, respectively, on the substrate surface. The spaced-apart floating gates are electrically isolated from each other. The first floating gate 4a partially overlaps the drain impurity region 2, while the second floating gate 4b partially overlaps the source impurity region 3.

A control gate 6 is provided to overlie the spaced-apart floating gates 4a and 4b with insulating layers 7a and 7b placed between the control gate 6 and the floating gates 4a and 4b, respectively. As seen in FIG. 3A, the control gate 6 is formed continuously extending into the region between the spaced-apart floating gates 4a and 4b. A gate insulation film 8 is provided to lie between the control gate 6 and the surface of the substrate 1, in the region between the spaced-apart floating gates 4a and 4b.

The gate insulation films 5a and 5b and the gate insulation film 8 are preferably formed to have the same thickness in order to make sure that an inversion region (or a channel region) is created in the substrate surface between the floating gates 4a and 4b.

Several different techniques may suitably be used to provide the gate insulation films 5a and 5b and 8 of an identical thickness.

For example, the following process can be employed. First, the gate insulation film 5a, 5b and 8 are simultaneously formed of the same dielectric film. Then, the floating gates 4a and 4b as well as a part of the control gate 6 between the floating gates 4a and 4b are simultaneously formed in the same manufacturing step. After the entire exposed surface of the device is covered with the interlayer insulation film 7a and 7b, only the previously formed part of the control gate 6 is exposed by a known etching process. Finally, the control gate 6 is formed, on the insulation layer 7a and 7b, extending to be in contact with the exposed part of the control gate to obtain a continuous single control gate 6.

Alternatively, the gate insulation films 5a, 5b and the gate insulation film 8 are simultaneously formed, followed by the formation of the floating gates 4a and 4b. The entire exposed surface of the device is then covered with the insulation layers 7a and 7b, and the portion of the insulating layers 7a and 7b corresponding to the region between the floating gates 4a and 4b is etched back. Thereafter, the control gate 6 is formed by patterning an electrically conductive layer deposited on the insulation films 5a, 5b and 8. The control gate 6 has a recessed structure at the center portion thereof.

The floating gates 4a and 4b and the control gate 6 are made, for example, of polysilicon.

The impurity regions 2 and 3 are made to have substantially the same electrical characteristics. For example, the impurity regions may have the same impurity concentration and diffusion depth. The memory cell is also made to have a symmetrical configuration with respect to a center line between the impurity regions 2 and 3.

Now, description is made of the operation of the memory cell. The double-gate EPROM cell of the present invention has two different modes of electron injection into the floating gates: an electron injection into the floating gate 4a (a data writing mode A); and an electron injection into the floating gate 4b (a data writing mode B). The data writing mode A is described with reference to FIG. 4A. In this mode, the control gate 6 is supplied with the gate voltage $V_G$ of about 5 V, and the drain impurity region 2 is supplied with the drain voltage $V_D$ of about 8.0 V. The semiconductor substrate 1 and the source impurity region 3 are coupled to zero volt of ground potential. The application of the gate voltage $V_G$ on the control gate produces an inversion layer in the channel region between the impurity regions 2 and 3. However, with the drain region 2 kept at a high potential level of about 8.0 V, the channel region disappears in the vicinity of the drain region 2 because of the pinch-off phenomenon. The drain voltage $V_D$ on the drain region 2 creates a high intensity electric field in the pinched-off region. Electrons getting into the pinched-off region are accelerated by the high intensity electric field into hot electrons, which are injected through the gate insulation film 5a into the floating gate 4a thereby to effectuate the programming or writing mode A. Hot electrons are produced only in the neighborhood of the drain region 2 since the pinched-off region appears in the vicinity of the drain region which is being supplied with a high voltage. With no pinched-off region formed in the vicinity of the source region 3, no hot electrons are generated in this area and hence the other floating gate 4b is not subjected to injection of hot electrons. Thus, selective injection of hot electrons into the floating gate 4a can be surely performed. The threshold voltage in the writing mode A, i.e., the voltage at which the inversion region appears in the MOS transistor is approximately 2 V. That is, the threshold voltage of the memory transistor is shifted slightly into a positive direction, by hot electron injection only into the floating gate 4a.

In the writing mode B, the control gate 6 is supplied with the gate potential $V_G$ of 12.5 V, while the source region 3 with the source potential $V_S$ of some 8.0 V. The drain region 2 and the semiconductor substrate 1 are coupled to ground potential of 0 volt. Under the conditions, a pinched-off region is created in the vicinity of the source region 3, and electrons in the pinched-off region are excited into hot electrons by the high intensity electric field generated in the neighborhood of the source impurity region 3. The hot electrons are injected through the gate insulation 5b into the floating gate 4b thereby to effect the data writing B. With the drain region 2 at ground potential, there exist no hot electrons in the vicinity of the drain region since no pinched-off region is provided because of no generated high intensity electric field in that region. Hence no electron injection takes place on the other floating gate 4a under such circumstances. Due to the fact that the impurity regions 2 and 3 have the identical electric characteristics, that the floating gates 4a and 4b have the identical configuration, and that the memory cell transistor is of symmetrical construction with respect to the center of the channel region, the hot electrons are injected into the floating gate 4b in the data writing mode B in an amount substantially equal to the hot electrons to be injected into the other floating gate 4a in the data writing mode A. Thus, the threshold voltage of the MOS memory transistor is also at some 2 V in the writing mode B.

Figure 4A:
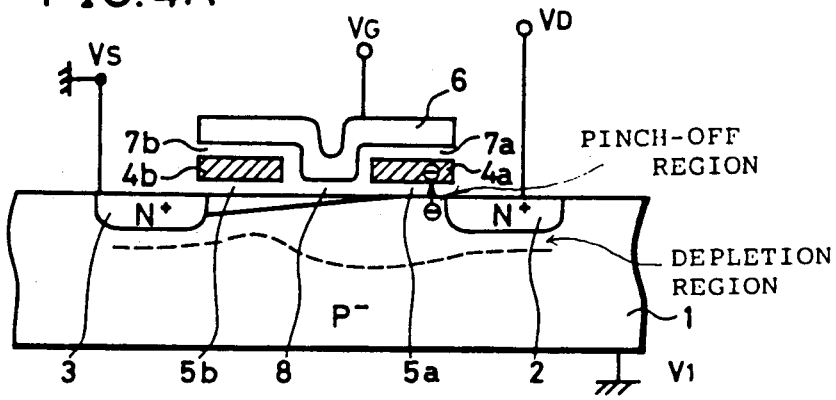
FIGS. 4A and 4B illustrate the data programming operation of the EPROM cell of the invention shown in FIGS. 3A and 3B.
Figure 4B:
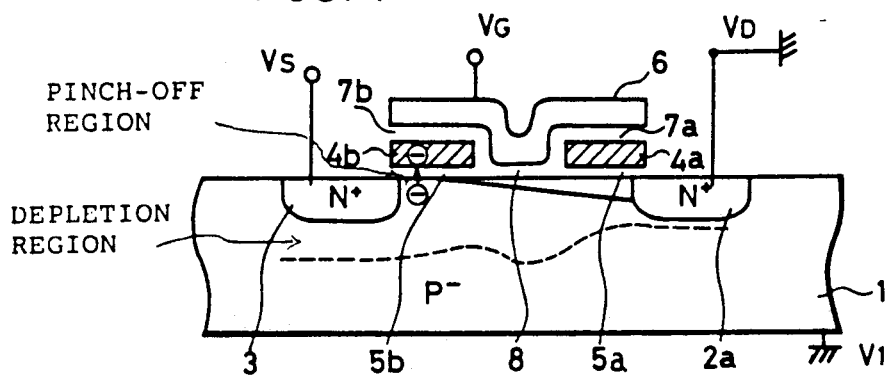

In FIGS. 4A and 4B, the depletion layer regions and the channel regions are schematically shown for illustrative purposes. The application of high voltage of 12.5 V on the control gate 6 results in a formation of a considerably strong inversion layer near the gate insulation 8. Since the inversion layer is formed only directly under the gate insulation film 8, it bears little effect on the pinched-off region to be created in the neighborhood of the drain region 2 and the source region 3.

The injection of electrons into both floating gates 4a and 4b is now explained. When it is intended to introduce electrons into both floating gates by performing the writing mode A followed by the writing mode B, the control gate 6 is supplied, during the succeeding writing mode B, with a high potential of 12.5 V which is much higher than the threshold voltage of 2 V resulting from the preceding writing mode A. Thus, in the writing mode B, the channel region is also produced between the impurity regions 2 and 3, and hot electrons are created in the pinched-off region in the neighborhood of the source region 3. When the writing mode B is performed in combination with and following the writing mode A for the dual data writing on the floating gates 4a and 4b, the control gate 6, the source region 3, the drain region 2 and the semiconductor substrate 1 may be supplied with those respective voltages as employed in the single data writing mode B thereby to effect the desired electron injection for the data writing or programming. This is true of a dual data writing mode where the writing mode A is performed in combination with and subsequent to the writing mode B.

In the dual data writing mode, since the floating gates 4a and 4b are separately and independently undergo the injection of electrons, the MOS memory transistor has the threshold voltage of about 2 V. However, the conductance of the MOS memory cell transistor is reduced.

The erasing of the memory cell data is carried out by exposing the memory cells to UV light as in the prior art. The exposure to the UV irradiation causes the electrons trapped on the floating gates 4a and 4b to be removed therefrom into the control gate 6 as well as the semiconductor substrate 1 in a manner as stated previously. After the data erasure, the memory cell transistor has a threshold voltage of about 1 V which is substantially equal to that in the prior-art EPROM.

Figure 5:
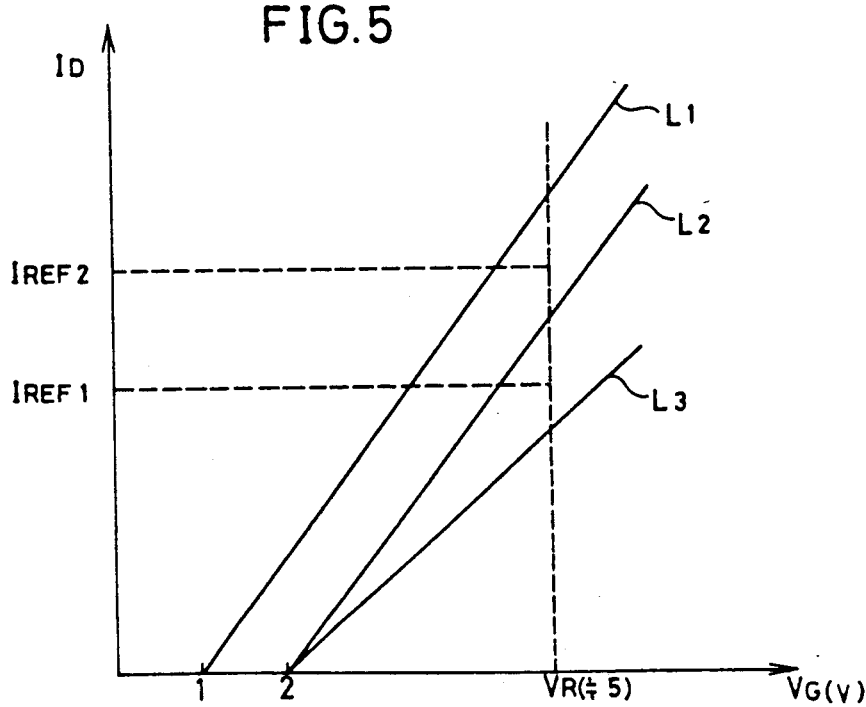
FIG. 5 is a graphic representation showing the gate voltage to the drain current relations of the EPROM cell according to the invention.

Referring to FIG. 5, there is illustrated relations between the gate potential $V_G$ and the drain current $I_D$ in the EPROM cell of the present invention. The straight line L1 shows $V_G$ to $I_D$ relation in the erased state; the line L2 illustrates similar relations in the single-gate programming state where electrons are injected into either one of the floating gates; and line L3 depicts similar relation in a dual-gate programming state where electrons are injected into both floating gates. As stated previously, the memory cell transistor has a threshold voltage of about 2 V not only in the single-gate data writing of the mode A or the mode B, but also in the dual-gate data programming of the combined mode A and mode B. However, the conductance of the MOS memory cell transistor is smaller in the dual-gate data writing than in the single-gate data writing because of the fact that the inversion layer in the channel region which is modulated by the gate voltage $V_G$ is affected only by one of the floating gates 4a and 4b in the single data writing, whereas it is influenced by both of the floating gates 4a and 4b in the dual-gate data writing. Under the condition where both floating gates have an effect on the channel region, the mobility of the electrons in terms of the whole channel region is smaller in the dual-gate data writing than in the single-gate data writing, or the channel width gets smaller in the former than in the latter. Accordingly, the characteristic line L2 for the single-gate data writing slopes sharply as compared to the characteristic line L3 for the dual-gate data writing.

If the read-out volta $V_R$ to be applied to the control gate 6 is set at some 5 V in the read-out of the memory cell data, there is a great difference in the flow of the drain current $I_D$ between the single-gate data writing and the dual-gate data writing. The same applies to the characteristic line L1 for the erasure state and the characteristic line L2 for the single-gate data writing. Thus, if a first reference current Iref 1 and a second reference current Iref 2 are respectively determined for the read-out voltage of about 5 V, it becomes possible to read out 3-logic level data from the memory cell by comparing the drain current $I_D$ and the reference currents.

Normally, the data of an EPROM cell in the form of the drain current $I_D$ is detected to be amplified by the sense amplifier. For the 3-level data read-out, the sense amplifier is supplied with the two reference currents Iref 1 and Iref 2, and it functions to compare the drain current $I_D$ through the read-out memory cell with the reference currents Iref 1 and Iref 2.

When $I_D >$ Iref 2, the stored data is defined as a "0".
If Iref $1 < I_D <$ Iref 2, the data is a "1".
When $I_D <$ Iref 1, then the stored data is defined to be a "2".

This definition makes possible the 3-level data storage and read-out. The erased memory cell bears a "0" whereas the same memory cell holds a "1" on the single-gate data writing and a "2" on the dual-gate data writing. In marked contrast to the conventional EPROM cell which stores the data in the logic forms of a "0" and a "1", the EPROM of the present invention is capable of non-volatile storage of data in three different logic levels. It means that the present memory cell has a storage capacity one and half times as great as the conventional EPROM cell, which leads to the EPROM device of far greater storage capacity and higher integration.

Figure 6:
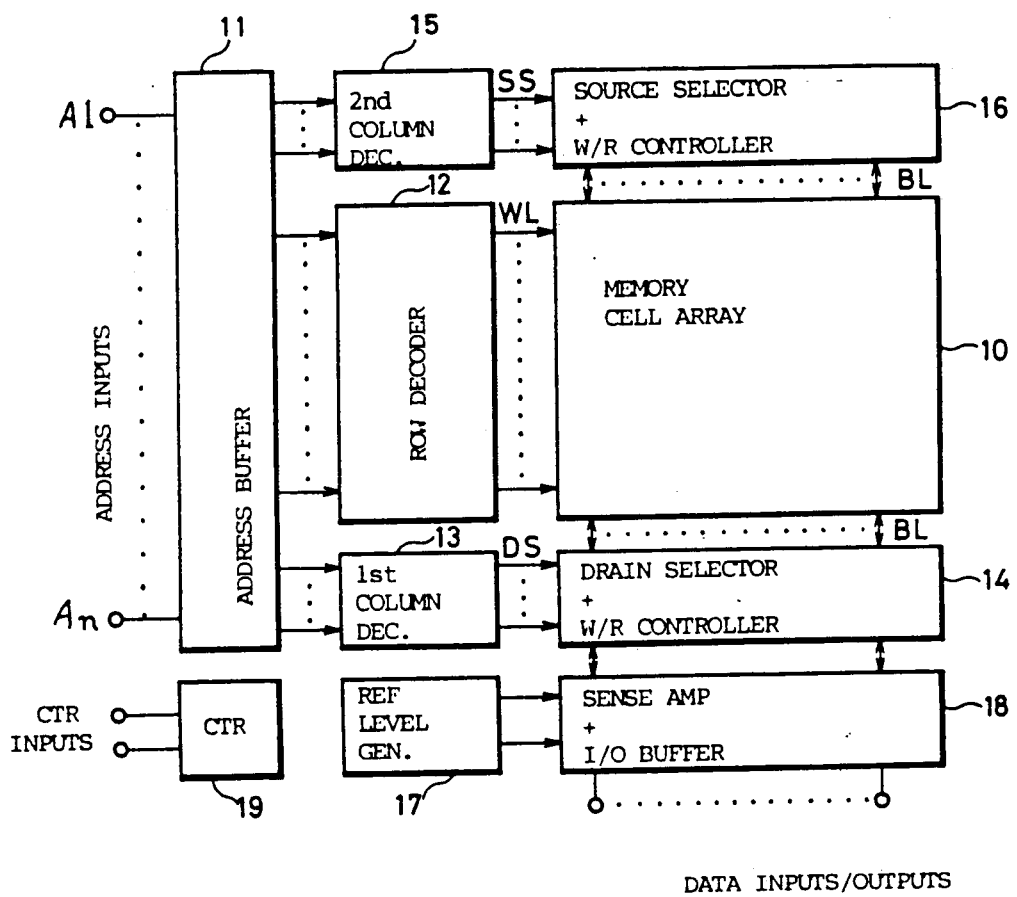
FIG. 6 is a block diagram showing an overall arrangement of a non-volatile semiconductor memory device according to an embodiment of the present invention.

A memory device incorporating the EPROM cells of the type described is now explained in its construction and operation having reference to FIG. 6. A memory cell array 10 includes a plurality of EPROM cells arranged in a matrix of rows and columns. The columns include source column lines and drain column lines.

For the selection of one row in the memory cell array, there are provided an address buffer 11 which functions to produce an internal row address in response to externally applied address input signals Al-An; and a row decoder 12 which is operable in response to the internal row address from the address buffer 11 to select one word line (or row selection line) WL.

For the selection of a desired column in the memory cell array 10, there are provided two pathways. One pathway is for selecting the column to which the drains of the memory cells in the array 10 are coupled and involves a first column decoder 13 for decoding a first internal column address supplied from the address buffer 11, and a drain selector block 14 operable in response to the decode signal from the first column decoder 13 to select the particular column to which the drains of the memory cells to be addressed is coupled. The drain selector block 14 includes a W/R controller for selecting data writing and reading modes as well as the data writing modes A and B.

The other pathway for column selection is for selecting the particular column to which the source of the memory cell to be addressed is coupled. The second pathway involves a second column decoder 15 for decoding a second internal column address from the address buffer 11 and a source selector block 16 operable in response to the decode signal from the second column decoder 15 to select a corresponding column in the memory cell array 10. The source selector block 16 also contains a W/R controller for selective control of the data writing and reading operations and of the writing modes A and B.

The first column decoder 13 and the drain selector block 14 are coupled together by drain select lines DS, while a second column decoder 15 and the source select block 16 are connected together by source select lines SS. Bit lines couple the drain select block 14 to the memory cell array on one hand, and the source select block 16 to the memory cell array 10 on the other.

For data storage and read-out, the memory device also includes a reference level generator 17 for providing, during data read-out, two reference currents to the sense amplifier 18 which compares the supplied reference currents with the current on the selected column of the memory cell array 10. An I/0 buffer for the data transmission between the memory device and a device external to the EPROM device is shown in the same block as the sense amplifier 18. A timing controller 19 generates timing signals for controlling various operations of the memory device including the data writing and reading.

The selection of the data writing mode A and/or the data writing mode B is under control of the control signal from the controller 19 according to applied data.

Figure 7:
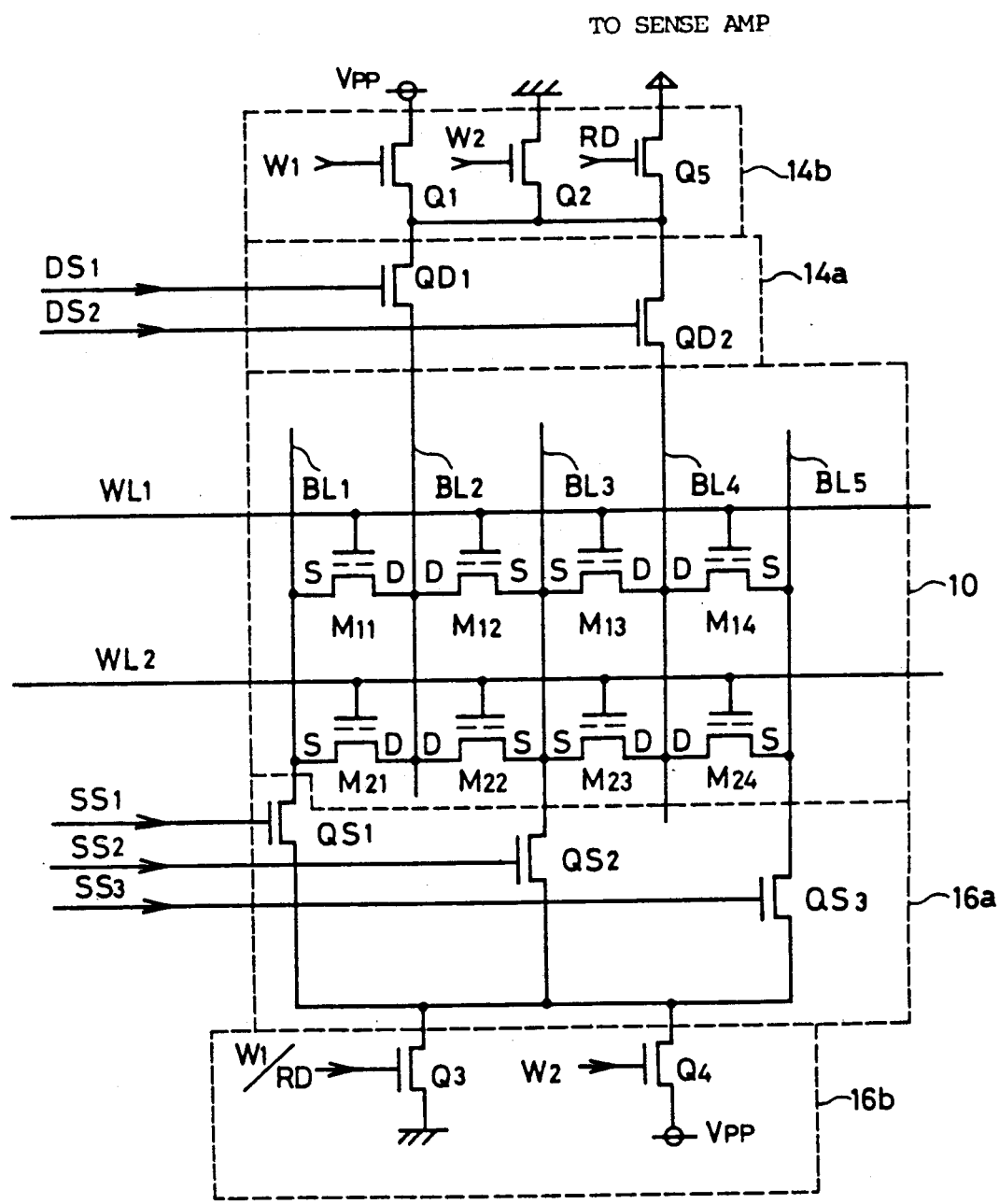
FIG. 7 is a diagrammatic representation of the memory cell array and its associated component parts for data writing and reading in the non-volatile semiconductor memory device of FIG. 6.

Referring to FIG. 7, there is schematically illustrated in more detail the arrangement of the memory cell array and the drain and source selector blocks 14 and 16 with respective W/R controllers of FIG. 6. In FIG. 7, the memory cells are shown arranged in a matrix of two rows and four columns. Memory cells M11-M14 in one row are connected to a word line WL1, and memory cells M21-24 in the other row are coupled to a word line WL2. In the column arrangement of the memory cell array 10, source select lines and drain select lines are arranged alternately. Thus, a total of five bit lines BL1 to BL5 are provided for the four columns of the array 10. More specifically, memory cells M11 and M21 in the first column have their sources coupled to the bit line BL1, and memory cells M11, M21, M12 and M22 in the first and second columns have their drains commonly connected to the bit line BL2. Likewise, the sources of the memory cells M12, M22, M13 and M23 in the second and third columns are connected to the bit line BL3, while the drains of the memory cells M13, M23, M14, M24 in the third and fourth columns are together connected to the bit line BL4. And finally, the memory cells M14 and M24 in the fourth column have their sources connected to the bit line BL5.

The drain selector 14a includes drain select transistors QD1 and QD2 which are connected in series with the bit lines BL2 and BL4, respectively. One drain select transistor QD1 is coupled to the first column decoder 13 via the drain select line DS1, and the other drain select transistor QD2 is connected to the first column decoder 13 via the drain select line DR2. The drain selector 14a operates in response to the decode signal from the first column decoder 13 to select one drain select (bit) line into connection with the W/R controller 14b.

The W/R controller 14b includes: a first writing transistor Q1 which is turned on by the application of the first write enable control signal W1 to couple the selected bit line to a high level writing voltage Vpp; a second writing transistor Q2 which is turned on by a second write enable signal W2 to connect a selected bit line to ground potential; and a read-out transistor Q5 to be turned on by a read enable signal RD for coupling the selected bit line to the sense amplifier in the data read-out operation. Thus, the control signals W1 and W2 designate the first and second writing mode A and B, respectively.

The source selector 16a includes: a source select transistor QS1 for selecting the bit line BL1; a source select transistor QS2 for selecting the bit line BL3; and a source select transistor QS3 for selecting the bit line BL5. The gates of these source select transistors QS1, QS2 and QS3 are coupled to the source select lines SS1, SS2, SS3, respectively, through which decode signals are supplied from the second column decoder 15 to those gates. The source selector 16a operates in response to output signals from the second column decoder 15 to select an addressed source select bit line into connection with the W/R controller 16b.

The second W/R controller 16b for the data writing and reading operations includes a writing transistor Q3 to be supplied at the gate with the first write enable signal W1 and the read enable signal RD; and a write transistor Q4 to be supplied at the gate with the second write enable signal W2. As the control signal is applied to its gate, the writing transistor Q3 is turned on to ground the selected bit line, whereas the transistor Q4 is turned on by the write enable signal W2 to couple the selected bit line to the writing high voltage Vpp.

In operation, when it is intended to write data into the memory cell M11, two modes of data writing are possible, one on the floating gate nearer to the bit line BL2, and the other on the floating gate closer to the bit line BL1. In effecting the data writing mode A by the injection of electrons into the floating gate closer to the bit line BL2, the read-out control signal RD is kept at an "L" level. A decode signal from the row decoder 12 selects the word line WL1, and the selected word line WL1 is boosted up to a data writing potential of about 12.5 V by a suitable high potential generator such as a Vpp switch and a charge pump which are commonly employed in the conventional EEPROMs or EPROMs. The potential Vpp' to be supplied to the bit line is generated at about 8.0 V. Decode signals from the first and second column decoders 13 and 15 turn on the drain select transistor QD1 and the source select transistor QS1 into selecting the bit lines BL1 and BL2. In response to the data to be written, the controller 19 functions to activate the write enable signal W1 into a "H" level, in response to which the writing transistors Q1 and Q3 are turned on. Consequently, the bit line BL1 is grounded, the bit line BL2 is kept at the Vpp' potential of about 8.0 V, and the word line WL1 is boosted up to the high level potential of 12.5 V, all for putting into effect the data writing mode A in which electrons are injected into the floating gate positioned closer to the bit line BL2 in the memory cell M11.

In order to perform the data writing mode B on the other floating gate disposed nearer to the bit line BL1 by the electron injection, the word line WL1 and the bit lines BL1 and BL2 are first selected as before. A control signal from the controller 19 activates a second writing signal W2 into a "H" level, which in turn renders conductive the writing transistors Q2 and Q4. Consequently, the bit line BL1 is raised in potential up to the Vpp' potential of 8.0 V and the word line WL1 is boosted to 12.5 V with the bit line BL2 grounded for effecting the data writing on the corresponding floating gate.

The data writing for other memory cells are carried out in a similar manner by first selecting a pair of bit lines on opposite sides of a particular memory cell in which the data is to be written, and then applying ground potential and the Vpp potential to the selected bit lines under control of the write enable signals.

For the data reading operation, the high level writing voltage Vpp is absent, and the word line WL is boosted up into a high potential level of about 5 V. When it is contemplated to read the data out of the memory cell M11, the word line WL1 and the bit line BL1 and BL2 are selected, while the transistors Q3 and Q5 are turned on by the read enable signal RD. The drain current $I_D$ flows into the selected memory cell M11 through the bit line BL2 as a result of the read-out voltage of the order of 1 V applied to the bit lines on data read-out. The drain current flow corresponds to the data stored in the memory cell M11. The drain current $I_D$ through the bit line BL2 flows via the transistor Q5 into the sense amplifier where it is compared with the two reference currents supplied from the reference current generator for the 3-level data read-out.

As will be readily understood from the above description, data can be written into or read out of the present EPROM cell using essentially the same procedures and potentials as in the conventional EPROM excepting that a pair of bit lines are simultaneously activated to select a given one of the memory cells. The data writing operation has been described as being carried out on one of the two floating gates by means of the electron injections thereinto. In order to write data into both floating gates for the dual-gate data storage, the single-gate data writing may be repeated on both floating gates by a successive and alternate application of the write enable signals W1 and W2. It should be noted that the flow of the drain current $I_D$ obtained in the single-gate writing on one floating gate is essentially identical to the one generated in a similar data writing on the other floating gate. Accordingly, for the single-gate data writing of a "1", only the write enable signal W1 may be activated into the "H" level all the time, and the write enable signal W1 and W2 may by alternately energized into the "H" level for the dual-gate data writing operation.

As stated previously, the transistors Q1 and Q4 are required to transfer a high potential signal of some 8.0 V onto the bit lines. Thus, the write enable signals W1 and W2 should be set at a potential level at which the transistors Q1 and Q4 can conduct the high level potential therethrough.

In the illustrated embodiments of the present invention, the memory cell has been shown and described as being designed for the 3-level non-volatile data storage. However, it is possible for the memory cell of the invention to hold 4-level data by suitably modifying the configurations of the floating gates 4a and 4b, and the data writing conditions including the applied potential levels as well as by suitably selecting the drain current to control gate voltage characteristics for the memory cell transistor forming the memory cell.

The 3-level data storage has been implemented by introducing electrons into a pair of floating gates which are designed electrically and geometrically in symmetry with each other. Its logical implication is that a 4-level data storage may be realized by designing the pair of floating gates in non-symmetrical configuration.

Figure 8:
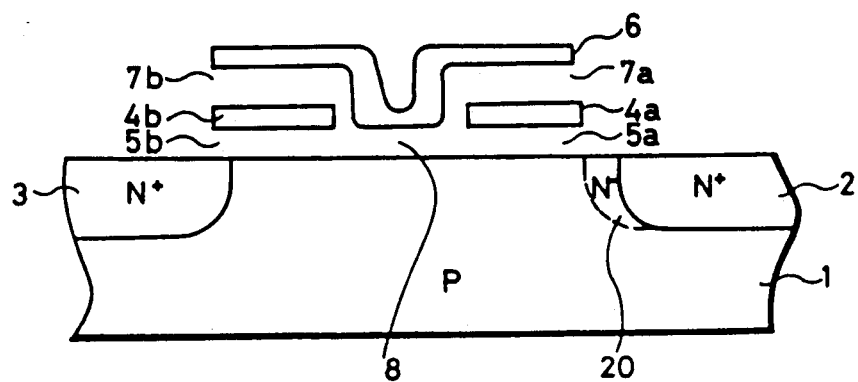
FIG. 8 is a schematic cross sectional view of an EPROM cell according to another embodiment of the present invention.

As stated herein above, the threshold voltage of the MOS memory cell transistor changes depending upon the amount of electron injected into its floating gates. Thus, the 4-level data storage function becomes feasible by making the two floating gates filled with different amounts of electrons. For the purpose, in another preferred embodiment of the invention as shown in FIG. 8, an $N^-$-type impurity region 20 of low impurity concentration is provided to the drain impurity region 2 to serve to weaken the high intensity electric field to be produced in the neighborhood of the drain region. In this structure, the first floating gate 4a is disposed to overlap the field-relaxing $N^-$-type impurity region 20. The provision of the field-relaxing impurity region 20 suppresses the hot electron generation in the area near the drain region 2 as compared to that in the vicinity of the source region 3 by making the electric field to be created in the neighborhood of the drain region 2 less intensive, even if the floating gates 4a and 4b are of the same configuration and the same level potentials are applied to both the source region 3 and the drain region 2. In this manner, the MOS transistor of the memory cell may have different electric characteristics including $I_D$ to $I_G$ characteristic depending on whether data is to be written into one floating gate 4a or the other floating gate 4b. This renders the 4-level data storage possible.

Figure 9:
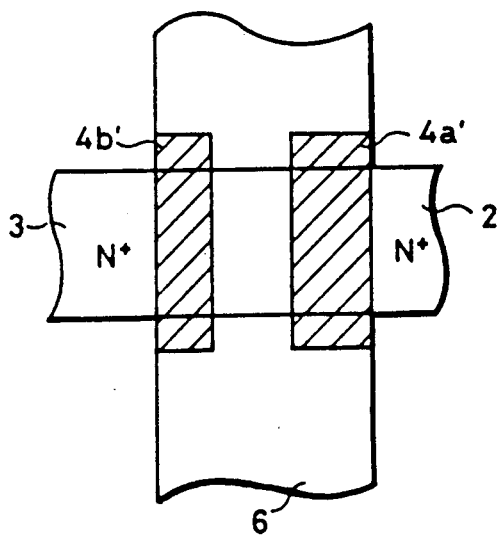
FIG. 9 is a schematic plan view of an EPROM cell according to another embodiment of the present invention.
Figure 10:
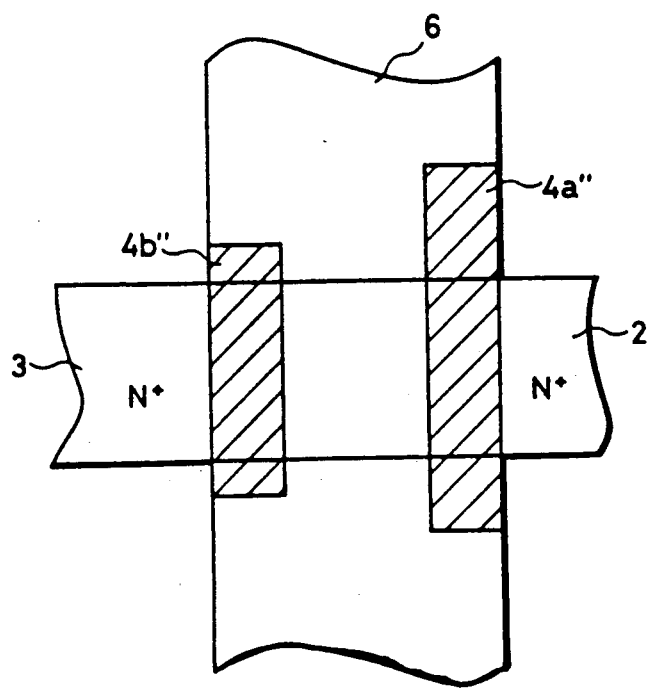
FIG. 10 is a schematic plan view of an EPROM cell according to still another embodiment of the invention.

In other embodiments shown in FIGS. 9 and 10, the floating gates 4a and 4b are formed in different shapes to implement the 4-level data storage function. Electron accumulation on the floating gate is dependent upon the combined capacitance which the floating gate forms with the control gate and with the semiconductor substrate. The greater the capacitance, the greater the amount of accumulated electrons. With the asymmetric configurations of the floating gates 4a' and 4b' in FIG. 9, and of the floating gates 4a'' and 4b'' in FIG. 10, the individual floating gates provide different capacitances, thus accumulating different quantities of electrons even under substantially the same electron injection conditions. As a result, the floating gates have varying threshold voltages and exhibit different $I_D$ to $I_G$ characteristics, all contributing to the 4-level data storage in the memory cell.

In any of the preferred embodiments of the present invention described above, the EPROM cell utilizes hot electron injection for the non-volatile information storage. However, the present invention is also applicable to a memory device where the data is written by means of avalanche electron injection or where the data writing depends on the electron injection by the tunneling current flowing through a tunneling oxide layer. In the EEPROM cell of the latter type, a very thin tunneling oxide layer may be formed over the areas where the floating gates 4a and 4b overlap the underlying drain and source regions 2 and 3, respectively, in order to implement the data writing and reading as in the previous embodiments. Needless to say, the electrical conditions under which the data writing is performed in the EEPROM cells are different from those in the EPROM cells.

As is apparent from the foregoing detailed description, the improved non-volatile semiconductor memory cell of the floating gate type transistor incorporates a segmented floating gate structure where first and second floating gates are provided in electrical separation from each other. Data is written independently into the individual floating gates by separate injection of the electrons. The non-volatile data storage operation involves three different modes of data writing: writing data into one of the floating gates; writing data into both of the floating gates; and writing no data at all. This novel 3-level data storage substantially increases the storage capacity of the memory cell as compared to the conventional 2-level data storing memory cell, which contributes to an improvement of integration and storage capacity of a memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory cell for multi-level data storage comprising:
   a semiconductor substrate of one conductivity type;
   first and second impurity regions of a second conductivity type spaced apart in the surface of said semiconductor substrate;
   a first conductive layer provided over the surface area of said semiconductor substrate between said first and second impurity regions in a location closer to and in relation to overlap a portion significantly less than the entirety of said first impurity region with an insulating layer underlying said first conductive layer;
   a second conductive layer provided over the surface area of said semiconductor substrate between said first and second impurity regions, spaced from said first conductive layer, closer to and in relation to overlap a portion significantly less than the entirety of said second impurity region with a second insulating layer underlying said second conductive layer;
   said first and second conductive layers being electrically isolated from each other; and
   a third conductive layer provided to extend over and between said first and second conductive layers with a third insulating layer underlying said third conductive layer.

2. A non-volatile memory cell for multi-level data storage according to claim 1 wherein said first and second conductive layers have substantially an identical configuration.

3. A non-volatile memory cell for multi-level data storage according to claim 1, wherein said first and second conductive layers are arranged in symmetry with each other with respect to a center line between said first and second impurity regions.

4. A non-volatile memory cell for multi-level data storage according to claim 1, wherein said insulating layer provided between said first conductive layer and the surface of said semiconductor substrate, said second insulating layer provided between said second conductive layer and the surface of said semiconductor substrate, and a portion of said third insulating layer lying between said first and second conductive layers on the surface of said semiconductor substrate all have substantially the same thickness.

5. A non-volatile memory cell for multi-level data storage according to claim 1, wherein said first and second impurity regions are formed to have substantially the same electrical characteristics.

6. A non-volatile memory cell for multi-level data storage as recited in claim 1, wherein said first and second conductive layers are configured in shapes which differ from each other.

7. A non-volatile memory cell for multi-level data storage as recited in claim 1, wherein said first and second conductive layers are configured asymmetrically with respect to a center line of said third conductive layer.

8. A non-volatile memory cell for multi-level data storage as recited in claim 1, wherein said first impurity region comprises a first portion of relatively high impurity concentration and a second portion of relatively low impurity concentration and said first conductive layer overlaps said second portion.

9. A non-volatile memory cell for multi-level data storage comprising:
   a semiconductor substrate of one conductivity type;
   first and second impurity regions of a second conductivity type spaced apart in the surface of said semiconductor substrate;
   a first conductive layer provided over the surface area of said semiconductor substrate between said first and second impurity regions in a location closer to and in relation to overlap a portion significantly less than the entirety of said first impurity region with an insulating layer underlying said first conductive layer;
   a second conductive layer provided over the surface area of said semiconductor substrate between said first and second impurity regions, spaced form said first conductive layer, closer to and in relation to overlap a portion significantly less than the entirety of said second impurity region with a second insulating layer underlying said second conductive layer;
   said first and second conductive layers being electrically isolated from each other; and
   a third conductive layer provided to extend over and between said first and second conductive layers with a third insulating layer underlying said third conductive layer,
   wherein said first and second conductive layer comprise floating gates into which electrons are injected for non-volatile data storage, and said third conductive layer comprises a control gate which is supplied with a signal for controlling the electron injection into said first and second conductive layers and the selection of said memory cell.

10. A semiconductor memory device capable of 3-level data storage comprising:
    a memory cell array having a plurality o non-volatile memory cells arranged in a matrix of rows and columns, said columns including source column lines and drain column lines;
    each of said memory cells including an impurity region to serve as a drain of a memory cell and an impurity region to serve as a source of the memory cell which are provided spaced apart in the surface of a semiconductor substrate, first and second floating gates, each capable of individually storing charges in a programmed writing operation for three level logic data storage and provided in an electrical isolation from each other over the surface area of said semiconductor substrate between said impurity regions with an underlying insulation layers, and a control gate means in response to an externally applied address for selecting one row from said memory cell array;

means operable in response to said externally applied address to select a column from said memory cell array to which the source of the addressed memory cell is coupled;

means operable in response to said externally applied address to select a column of said memory cell array to which the drain of the addressed memory cell is coupled;

means operative in response to data to be written for applying predetermined potentials to said selected source column line and drain column line; and means to be activated on a data read-out portion for sensing the current flow through said selected drain column line.

11. A semiconductor memory device according to claim 10, further comprising means for providing two different reference currents to said current sensing means.

12. A semiconductor memory device according to claim 10 wherein said drain column lines and source column lines of said memory cell array are arranged alternately.

13. A non-volatile semiconductor memory device according to claim 10, wherein said control gate means is operable to apply a predetermined first high-level potential to the selected row in data writing, thereby applying said first high-level potential to the control gate of the selected memory cell.

14. A non-volatile semiconductor memory device according to claim 13, wherein said selected source column line and drain column line are supplied with ground potential and a second high-level potential lower than said first high-level potential in accordance with the data to be written under the control of said potential applying means.

15. A non-volatile semiconductor memory device according to claim 14 wherein said control gate means is operable on data read-out to apply to the selected row a third potential lower than said second high level potential.

16. A non-volatile memory cell for three or more levels of data storage comprising:

a semiconductor substrate of a first conductivity type, drain and source regions of a second conductivity type spaced apart in the surface of said substrate;

control gate means responsive to a voltage applied thereto in excess of a threshold voltage to effect conduction of current in said memory cell;

first storage means for storing electron charges to change the value of said threshold voltage to establish a first cell conduction level;

second storage means for storing electron charges to change the value of said threshold voltage to establish a second cell conduction level;

whereby a first logic data level is represented by the absence of charge in said first and second storage means, a second logic data level is represented by storage of charge in only said first storage means, and a third logic data level is represented by storage of charge in both said first and said second storage means; wherein said first storage means comprises a first floating gate conductive layer located above said substrate extending from a first end positioned between said drain and source regions to a second end positioned above a first one of said source and drain regions at an intermediate point thereof to partially overlap said region; and said second storage means comprises a second floating gate conductive layer, electrically isolated form said first floating gate conductive layer, and located above said substrate extending from a first end positioned between said drain and source regions to a second end positioned above an intermediate point of, and to partially overlap, a second one of said source and drain regions.

* * * * *